(12) United States Patent
Lai et al.

(10) Patent No.: US 11,089,684 B2
(45) Date of Patent: Aug. 10, 2021

(54) MOTHERBOARD MODULE AND ELECTRONIC DEVICE

(71) Applicant: GIGA-BYTE TECHNOLOGY CO., LTD., New Taipei (TW)

(72) Inventors: Chih-Ming Lai, New Taipei (TW); Chung-Wei Chiang, New Taipei (TW); Tzu-Hsiang Huang, New Taipei (TW); Yung-Shun Kao, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 90 days.

(21) Appl. No.: 16/553,143

(22) Filed: Aug. 27, 2019

(65) Prior Publication Data

US 2020/0389975 A1 Dec. 10, 2020

(30) Foreign Application Priority Data

Jun. 10, 2019 (TW) .................................. 108119881

(51) Int. Cl.
*H05K 1/11* (2006.01)
*H05K 1/14* (2006.01)
*G06F 1/18* (2006.01)

(52) U.S. Cl.
CPC ............... *H05K 1/14* (2013.01); *G06F 1/185* (2013.01); *H05K 1/11* (2013.01); *H05K 2201/044* (2013.01); *H05K 2201/10189* (2013.01); *H05K 2201/10325* (2013.01)

(58) Field of Classification Search
USPC ......................................................... 361/784
See application file for complete search history.

(56) References Cited

U.S. PATENT DOCUMENTS

| 7,035,117 | B2 | 4/2006 | Chen et al. |
| 2013/0161274 | A1* | 6/2013 | Lu ........................... G06F 1/186 211/41.17 |
| 2018/0373664 | A1* | 12/2018 | Vijayrao ............. G06F 13/4022 |

FOREIGN PATENT DOCUMENTS

| TW | M382698 | 6/2010 |
| TW | I548331 | 9/2016 |

* cited by examiner

*Primary Examiner* — Andargie M Aychillhum
(74) *Attorney, Agent, or Firm* — JCIPRNET

(57) ABSTRACT

A motherboard module is adapted for an M.2 expansion card to configure. The M.2 expansion card includes a connecting end and a fixing end. An edge of the fixing end has a semi-circular hole. The motherboard module includes a motherboard body, a locking member, and an abutting member. The motherboard body includes an expansion card slot, a first fixing hole, and a second fixing hole. The locking member is detachably fixed in the first fixing hole. The abutting member has a first end and a second end. The first end is detachably fixed in the second fixing hole. When the M.2 expansion card is installed on the motherboard module, the abutting member is located between the M.2 expansion card and the motherboard body, and the second end abuts against the M.2 expansion card. An electronic device is further provided.

18 Claims, 5 Drawing Sheets

MOTHERBOARD MODULE AND ELECTRONIC DEVICE

CROSS-REFERENCE TO RELATED APPLICATION

This application claims the priority benefit of Taiwan application serial no. 108119881, filed on Jun. 10, 2019. The entirety of the above-mentioned patent application is hereby incorporated by reference herein and made a part of this specification.

BACKGROUND OF THE INVENTION

1. Field of the Invention

The present invention relates to a motherboard module, and in particular, to a motherboard module for an M.2 expansion card to configure.

2. Description of Related Art

Generally, when an M.2 expansion card is installed, one end of the expansion card is typically inserted into a corresponding slot on a motherboard, and the other end opposite thereto is locked to a corresponding fixing hole on the motherboard by using a screw. Accordingly, it is required that fixing holes provided on the motherboard correspond to standard lengths of various M.2 expansion cards, for example, 42 mm, 60 mm, 80 mm, and 110 mm, so that a user can select an M.2 expansion card as needed. In short, a common motherboard is generally provided with a plurality of fixing holes corresponding to the foregoing sizes.

In operation, M.2 expansion card modules generate much thermal energy. Therefore, heat-dissipating assembly such as a heat-dissipating member with/without fins is usually provided, and such heat-dissipating assembly is generally required to be in complete contact with the M.2 expansion cards to achieve a favorable heat dissipation effect. Therefore, if it is impossible to bring the M.2 expansion cards into effective contact with the heat-dissipating member, the heat-dissipating efficiency will be reduced greatly. However, commercially available M.2 expansion cards may suffer from problems such as its thickness greater than a standard thickness or bent boards. Therefore, when both ends of such M.2 expansion cards are fixed to motherboards, the M.2 expansion cards may bend and dent at their central portion. As a result, it is impossible for the M.2 expansion cards to be in effective contact with the heat-dissipating member thereabove.

SUMMARY OF THE INVENTION

The present invention provides a motherboard module which can reduce a probability that an M.2 expansion card assembled thereon bends and dents.

The present invention provides an electronic device having the foregoing motherboard module.

The motherboard module of the present invention is adapted for the M.2 expansion card to configure. The M.2 expansion card includes a connecting end and a fixing end opposite to each other. An edge of the fixing end has a semi-circular hole. The motherboard module includes a motherboard body, a locking member, and an abutting member. The motherboard body includes an expansion card slot, a first fixing hole, and a second fixing hole located between the first fixing hole and the expansion card slot. The connecting end is inserted into the expansion card slot. The locking member is detachably fixed in the first fixing hole. The abutting member has a first end and a second end. The first end is detachably fixed in the second fixing hole. When the M.2 expansion card is installed on the motherboard module, the connecting end is inserted into the expansion card slot. The locking member passes through the semi-circular hole to fix the M.2 expansion card in the first fixing hole. The abutting member is located between the M.2 expansion card and the motherboard body, and the second end abuts against the M.2 expansion card.

In an embodiment of the present invention, the foregoing abutting member includes a locking portion and a supporting portion located on the locking portion, the locking portion is locked in the second fixing hole, and the supporting portion has a hardness smaller than that of the locking portion.

In an embodiment of the present invention, the foregoing supporting portion includes a foam pad, a silica gel pad, or a rubber pad, and the locking portion includes a screw.

In an embodiment of the present invention, the foregoing abutting member further includes a deformable portion connected between the locking portion and the supporting portion, the deformable portion is adapted for deformation to change a distance between the locking portion and the supporting portion.

In an embodiment of the present invention, the foregoing deformable portion includes a spring or a flexible bending portion.

In an embodiment of the present invention, the foregoing supporting portion is made of an insulating material.

In an embodiment of the present invention, the foregoing supporting portion has an outer diameter larger than an outer diameter of the locking portion and smaller than a width of the M.2 expansion card.

In an embodiment of the present invention, the foregoing abutting member includes a pogo pin portion and a locking portion, the locking portion is locked in the second fixing hole, the pogo pin portion is pushed to abut against the M.2 expansion card, and a portion where the pogo pin portion is in contact with the M.2 expansion card is made of an insulating material.

In an embodiment of the present invention, when the first end of the abutting member is fixed in the second fixing hole, a distance between the abutting member and the expansion card slot is between 40 mm and 85 mm.

The electronic device of the present invention includes an M.2 expansion card and the foregoing motherboard module. The M.2 expansion card includes a connecting end and a fixing end opposite to each other, and an edge of the fixed end has a semi-circular hole. When the M.2 expansion card is installed on the motherboard module, the connecting end is inserted into an expansion card slot. The locking member passes through the semi-circular hole to fix the M.2 expansion card in the first fixing hole, the abutting member is located between the M.2 expansion card and the motherboard body, and the second end abuts against the M.2 expansion card.

Based on the foregoing description, in the electronic device of the present invention, when the M.2 expansion card is installed on the motherboard module, the connecting end is inserted into the expansion card slot, and the locking member passes through the semi-circular hole to fix the M.2 expansion card in the first fixing hole. At this time, the first end of the abutting member is detachably fixed in the second fixing hole, and the second end of the abutting member abuts against the M.2 expansion card. That is, the M.2 expansion card is not only supported at the connecting end and the fixing end, but also supported by the abutting member disposed between the first fixing hole and the expansion card slot at a central portion of the M.2 expansion card. In this way, the motherboard module of the electronic device of the present invention can prevent the M.2 expansion card assembled thereon from bending and deforming and further causing the heat sink to be in incomplete contact with the M.2 expansion card.

In order to make the foregoing features and advantages of the present invention more apparent and easier to understand, a description of embodiments is given below with reference to the accompanying drawings.

DESCRIPTION OF THE EMBODIMENTS

In general, M.2 expansion cards are divided into single-sided expansion cards and double-sided expansion cards and have a standard thickness of 2.15 mm for single-sided expansion cards and 3.5 mm for double-sided expansion cards. However, commercially available M.2 expansion cards often suffer from problems such as an thickness unevenness and even exceed a specified thickness. An M.2 expansion card that is fixed to a motherboard by fixing both ends of the expansion card bends slightly over time. In addition, circuit boards of some M.2 expansion cards also suffer from problems such as board bending, provided that the circuit boards of such M.2 expansion boards bend downwardly. Both of the two cases result in ineffective contact between the M.2 expansion card and a heat sink attached thereto, thereby greatly reducing the heat-dissipating effect. Therefore, the present invention provides an electronic device and a circuit board module to solve the foregoing problems.

Figure 1:
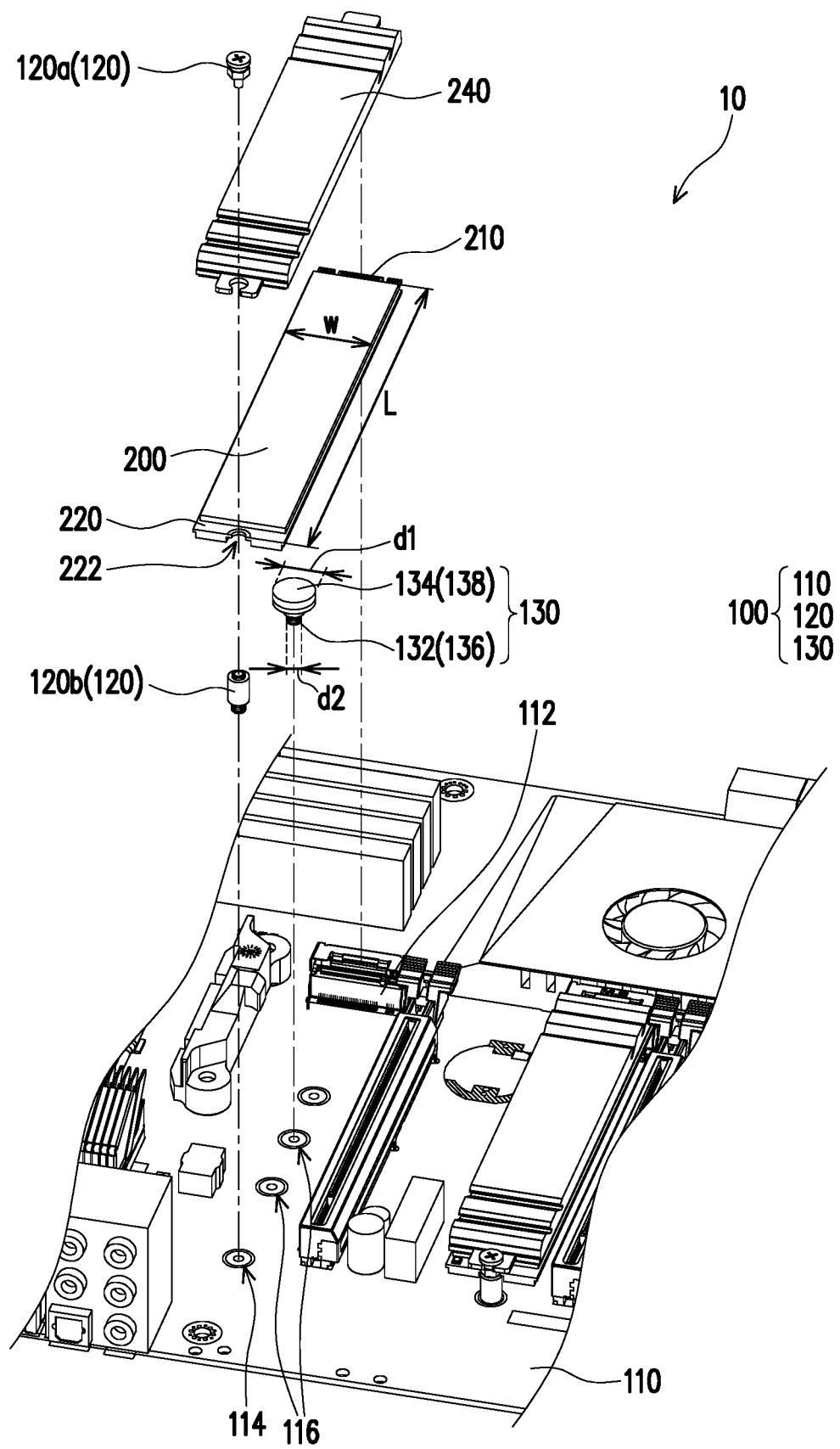
FIG. 1 is a partial schematic exploded view of an electronic device according to an embodiment of the present invention.

FIG. 1 is a partial schematic exploded view of an electronic device according to an embodiment of the present invention. Referring to FIG. 1, in this embodiment, an electronic device 10 includes an M.2 expansion card 200 and a motherboard module 100. The M.2 expansion card 200 includes a connecting end 210 and a fixing end 220 opposite to each other. An edge of the fixing end 220 has a semi-circular hole 222. The motherboard module 100 includes a motherboard body 110, a locking member 120, and an abutting member 130.

It should be noted that, in other embodiments, there is no restrictions in the present invention on a size and a form of the M.2 expansion card, and a user can select an M.2 expansion card as needed, but the present invention is not limited thereto. Moreover, a heat sink 240 is optionally disposed above the M.2 expansion card 200 of this embodiment, and there's no restriction in the present invention on a form of the heat sink 240.

Figure 2A:
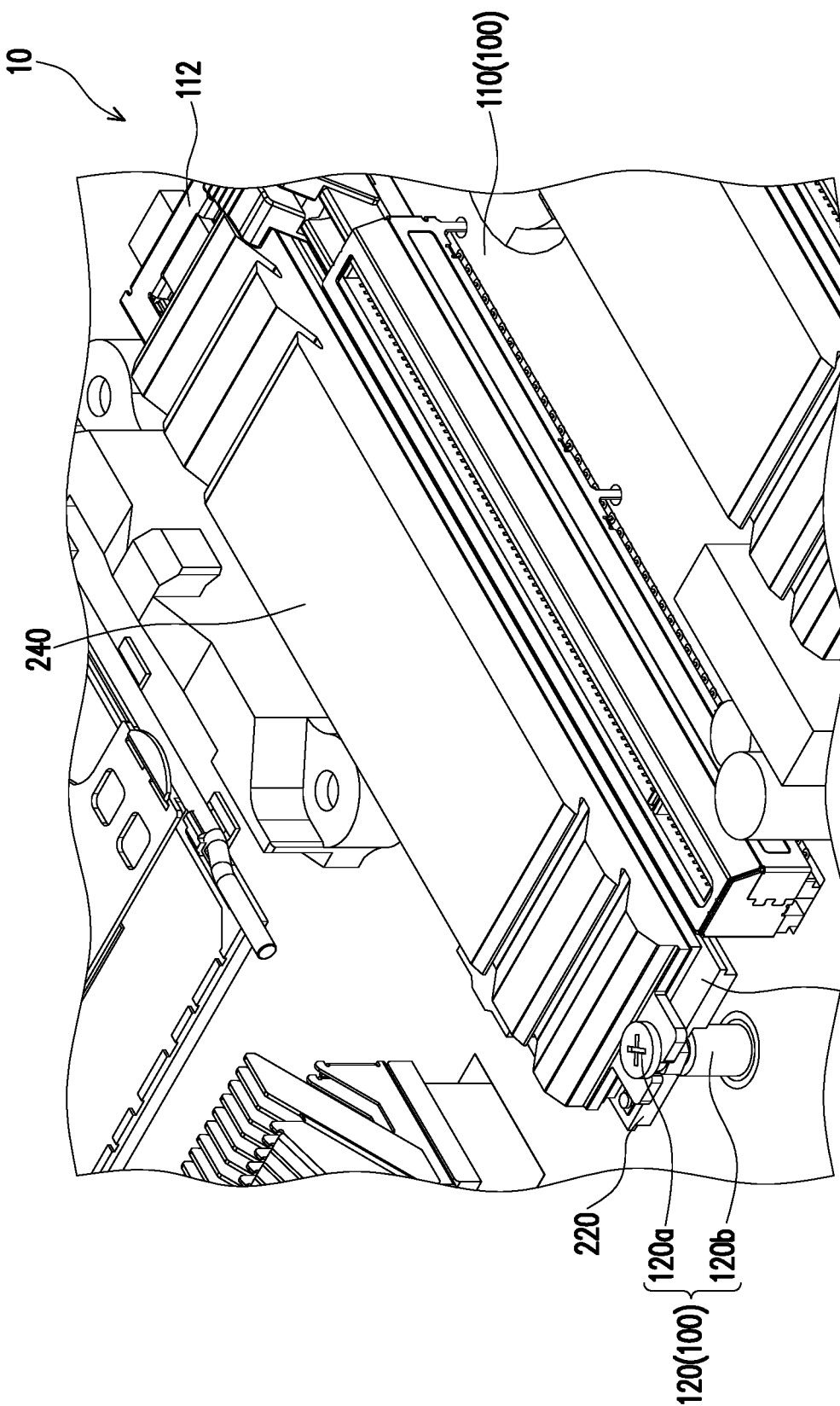
FIG. 2A is a partial schematic enlarged view of an M.2 expansion card and a heat sink assembled on a motherboard module of the electronic device of FIG. 1.
Figure 2B:
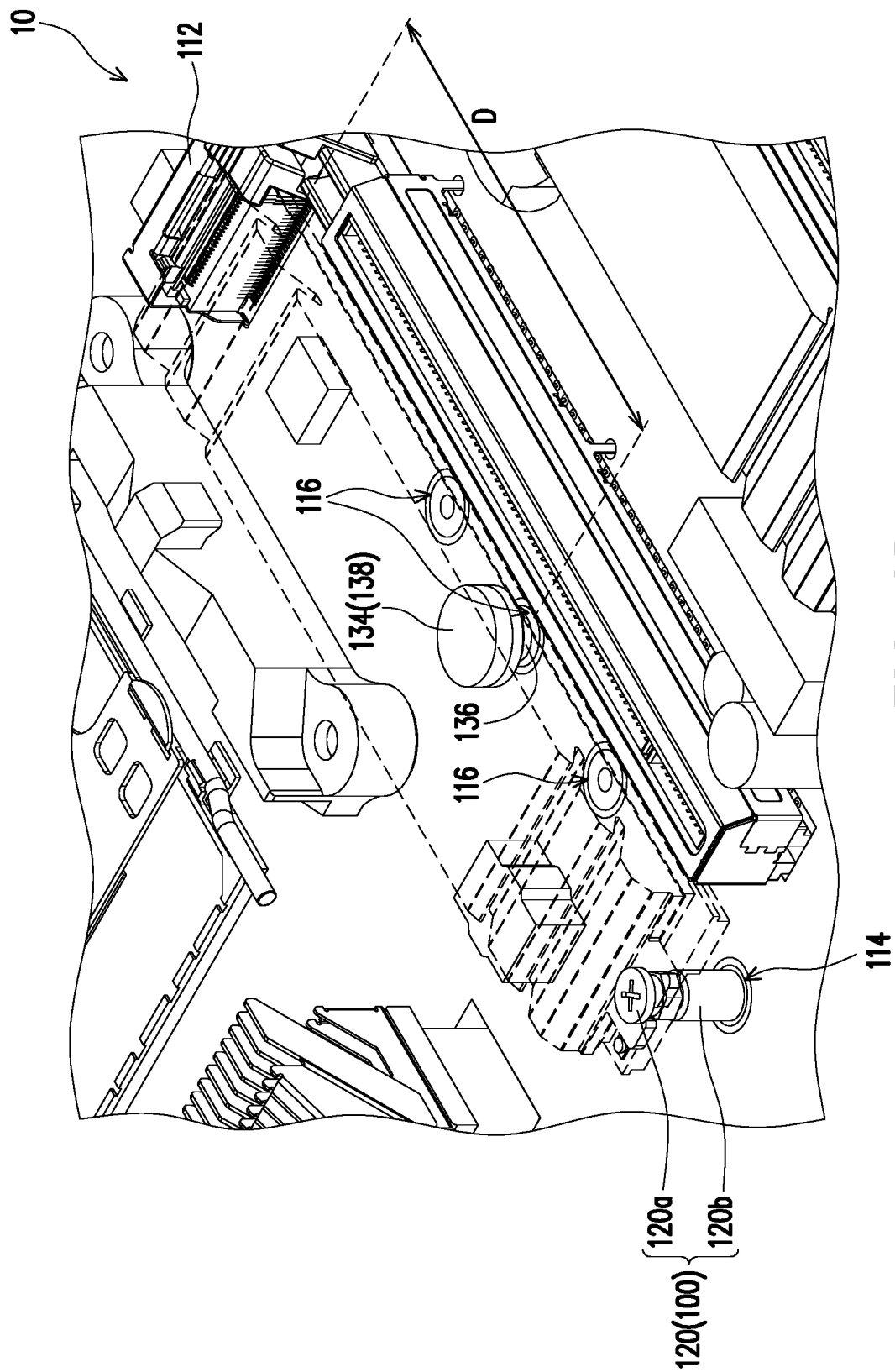
FIG. 2B is a schematic perspective view of the M.2 expansion card and the heat sink of FIG. 2A.

FIG. 2A is a partial schematic enlarged view of an M.2 expansion card and a heat sink assembled on a motherboard module of the electronic device of FIG. 1. FIG. 2B is a schematic perspective view of the M.2 expansion card and the heat sink of FIG. 2A. Referring to FIG. 1, FIG. 2A, and FIG. 2B, in detail, in this embodiment, the motherboard body 110 includes an expansion card slot 112, a first fixing hole 114, and a second fixing hole 116, the second fixing hole 116 of the motherboard body 110 being located between the first fixing hole 114 and the expansion card slot 112 of the motherboard body. In this embodiment, the first fixing hole 114 refers to a hole in which the fixing end 220 of the M.2 expansion card 200 is fixed, and the second fixing hole 116 refers to a hole in which the abutting member 130 may be disposed.

It should be noted that, in this embodiment, as shown in FIG. 1, the locking member 120 is, for example, a combination of a screw 120a and a stud 120b. In detail, the screw 120a is fixed in the first fixing hole 116 of the motherboard 110 via the stud 120b. When the M.2 expansion card 200 is installed on the motherboard module 100, the connecting end 210 of the M.2 expansion card 200 is inserted into the expansion card slot 112, and the fixing end 220 of the M.2 expansion card 200 is lapped on the stud 120b. The screw 120a then passes through the semi-circular hole 222 of the fixing end 220 to be locked in the stud 120b. A nut of the screw 120a is pressed against the fixing end 220 of the M.2 expansion card 200, so that the fixing end 220 of the M.2 expansion card 200 is sandwiched between the nut of the screw 120a and the stud 120b.

In addition, the same set of locking member 120 or another set of locking members 120 can also fix the heat sink 240 to the M.2 expansion card 200. More specifically, in this embodiment, the M.2 expansion card 200 has a same length as the heat sink 240, so they can be fixed through the same set of locking members 120. The heat sink 240 may be lapped on the M.2 expansion card 200, and the nut of the screw 120a is pressed against an end of the heat sink 240, so that the fixing end 220 of the M.2 expansion card 200 and the end of the heat sink 240 are sandwiched between the nut of the screw 120a and the stud 120b together.

Certainly, in other embodiments, the fixing end 220 of the M.2 expansion card 200 may also be directly locked in the first fixing hole 116 of the motherboard 110 by using a long screw, but the present invention is not limited thereto. Further, the heat sink 240 may also be fixed in other fixing manners, but the present invention is not limited thereto.

In addition, in this embodiment, the abutting member 130 has a first end 132 and a second end 134, the first end 132 of the abutting member 130 being detachably fixed in the second fixing hole 116. When the M.2 expansion card 200 is installed on the motherboard module 100, the abutting member 130 is positioned between the M.2 expansion card 200 and the motherboard body 110, and the second end 134 of the abutting member 130 abuts against a portion of the M.2 expansion card 200 that is located between the connecting end 210 and the fixing end 220 of the M.2 expansion card.

Based on this configuration, in the electronic device 10 of the present invention, the second end 134 of the abutting member 130 abuts against and supports the M.2 expansion card 200, so that the M.2 expansion card 200 does not bend downwardly and deform, thus further ensuring that the M.2 expansion card 200 is in complete contact with the heat sink 240 and therefore achieving a favorable heat-dissipating effect.

Figure 3:
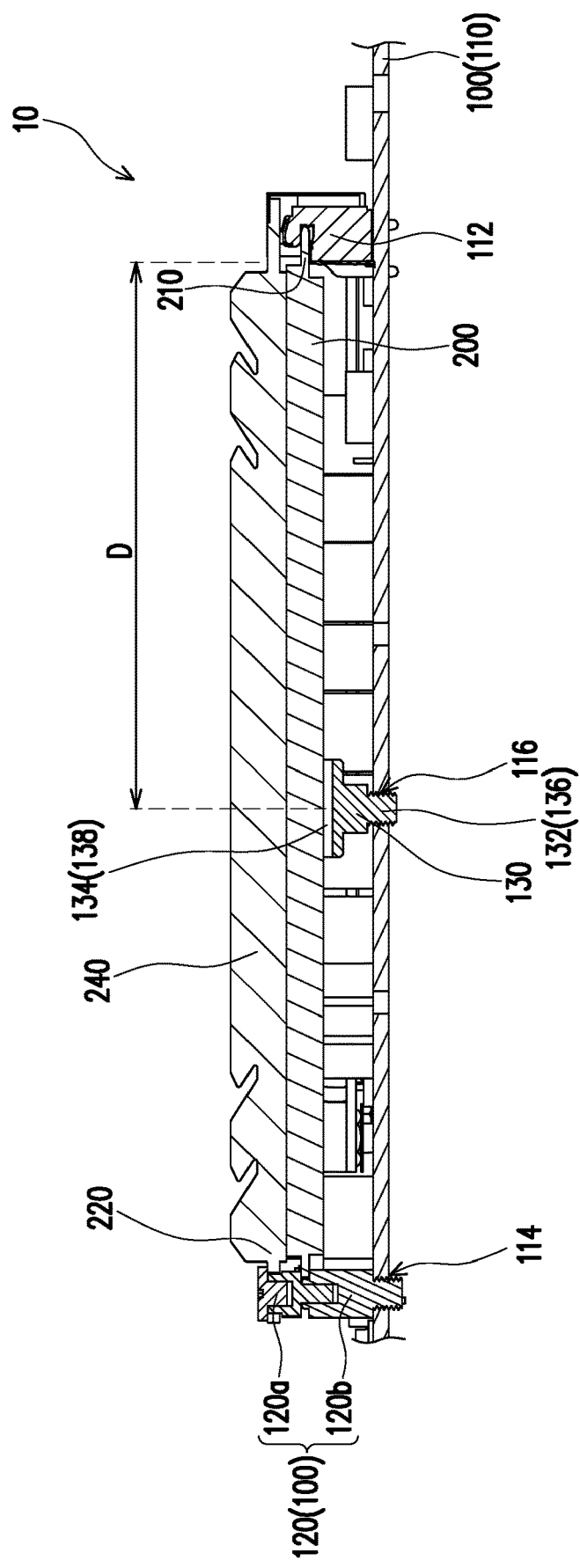
FIG. 3 is a partial schematic sectional view of the electronic device of FIG. 1.

FIG. 3 is a partial schematic sectional view of the electronic device of FIG. 1. Referring to FIG. 1, FIG. 2B, and FIG. 3, it should be noted that, the M.2 expansion card 200 generally has a length L of 42 mm, 60 mm, 80 mm, or 110 mm. Therefore, a plurality of fixing holes corresponding to the above-mentioned length L of the M.2 expansion card 200 are usually disposed on the motherboard. Further, in this embodiment, as shown in FIG. 2B, when a user intends to install an M.2 expansion card 200 with a length L of, for example, 110 mm, the first fixing hole 114 is a fixing hole on the motherboard body 110 that corresponds to the M.2 expansion card 200 with the length L of 110 mm, and the second fixing hole 116 is a fixing hole corresponding to an expansion card with a length L of 80 mm, 60 mm, or 42 mm.

That is, in another embodiment not drawn, when the user intends to install an M.2 expansion card 200 with a length L of, for example, 80 mm, the first fixing hole 114 is a fixing hole on the motherboard body 110 that corresponds to the M.2 expansion card 200 with the length L of 80 mm, and the second fixing hole 116 is a fixing hole corresponding to an M.2 expansion card with a length L of 60 mm or 42 mm. In other words, in yet another embodiment not drawn, when the user intends to install an M.2 expansion card 200 that has a length L of, for example, 60 mm, the first fixing hole 114 is a fixing hole on the motherboard body 110 that corresponds to the M.2 expansion card 200 with the length L of 60 mm, and the second fixing hole 116 is a fixing hole corresponding to an M.2 expansion card with a length L of 42 mm. Accordingly, when the first end 132 of the abutting member 130 is fixed in the second fixing hole 116, a distance D between the abutting member 130 and the expansion card slot 112 is between about 40 mm and 85 mm.

Based on this design, the electronic device 10 of this embodiment not only can solve the problem that the M.2 expansion card 200 bends downwardly and deforms, but also can use an existing fixing hole for the M.2 expansion card on the motherboard body 110 as the second fixing hole 116, without further changing a construction of the motherboard, as long as the abutting member 130 is attached. Therefore, the electronic device 10 of this embodiment is greatly adaptable and versatile.

Figure 4A:
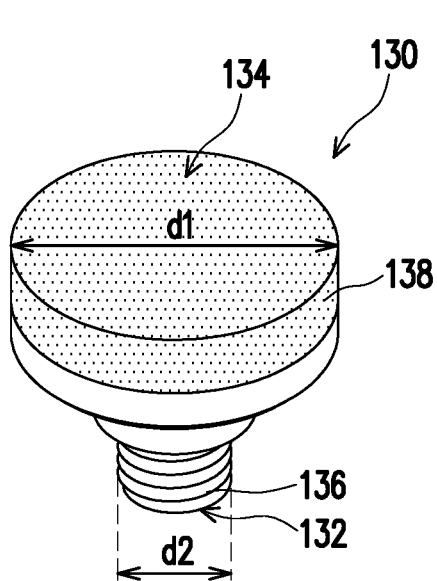
FIG. 4A is a schematic three-dimensional view of an abutting member for the electronic device of FIG. 1.

FIG. 4A is a schematic three-dimensional view of an abutting member for the electronic device of FIG. 1. Referring to FIG. 1, FIG. 3, and FIG. 4A, in this embodiment, the abutting member 130 includes a locking portion 136 and a supporting portion 138. The abutting member 130 is locked in the second fixing hole 116 via the locking portion 136, and the supporting portion 138 is located on the locking portion 136. Further, the supporting portion 138 is configured to support and abut against the M.2 expansion card 200. Moreover, the supporting portion 138 has a hardness smaller than that of the locking portion 136.

In addition, in this embodiment, the supporting portion 138 of the abutting member 130 has an outer diameter d1 greater than an outer diameter d2 of the locking portion 136 but smaller than a width W of the M.2 expansion card 200. A larger outer diameter of the supporting portion 138 can increase a contact area between the supporting portion and the M.2 expansion cards 200 and reduce a pressure between the two. However, the outer diameter of the supporting portion 138 is smaller than the width W of the M.2 expansion card 200 to avoid affecting a circuit layout space above the motherboard body 110.

For example, in this embodiment, the supporting portion 138 includes a foam pad, a silica gel pad, or a rubber pad, and the locking portion 136 is, for example, a metal screw. Certainly, in other embodiments, there's no restriction in the present invention on a material of the supporting portion 138, as long as the supporting portion 138 is made of an insulating material, to avoid a short circuit. In addition, the locking portion 136 is not necessarily a metal screw, and instead, it may be any structure that can detachably fix the abutting member 130 in the second fixing hole 116. However, the present invention is not limited thereto. Moreover, the locking portion 136 may also be a plastic screw. Therefore, the supporting portion 138 and the plastic screw can be integrally formed. Certainly, the present invention is not limited thereto.

Figure 4B:
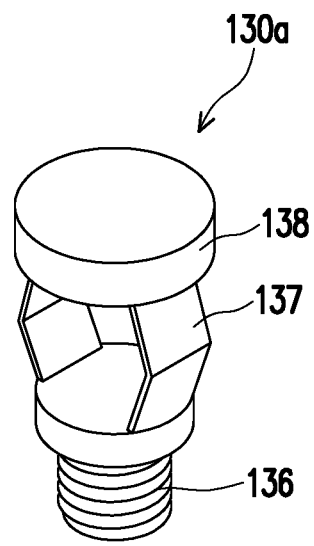
FIG. 4B is a schematic three-dimensional view of an abutting member for an electronic device according to another embodiment of the present invention.

FIG. 4B is a schematic three-dimensional view of an abutting member for an electronic device according to another embodiment of the present invention. Referring to FIG. 1, FIG. 3, and FIG. 4B, in this embodiment, as shown in FIG. 4B, the abutting member 130a further includes a deformable portion 137 that is connected between the locking portion 136 and the supporting portion 138. For example, in this embodiment, the deformable portion 137 may be a flexible bending portion, and the deformable portion 137 is adapted for deformation to change a distance between the locking portion 136 and the supporting portion 138.

Further, the abutting member 130a of this embodiment assumes a special shape for the deformable portion 137, such that the deformable portion 137 is resilient and further functions to buffer and support the M.2 expansion card 200. Besides, buffering for deformation can also prevent the abutting member 130a from transmitting an excessive force to the M.2 expansion card 200 and causing damage. Certainly, in other embodiments, the deformable portion 137 is not necessarily manufactured in a shape as shown in FIG. 4B, but may be manufactured in other shapes having a buffering function. However, the present invention is not limited thereto. In this embodiment, the locking portion 136, the deformable portion 137, and the supporting portion 138 of the abutting member 130a are, for example, integrally formed and are made of, for example, plastic. However, the present invention is not limited thereto. In an embodiment, the deformable portion 137 may also be made of metal.

Figure 4C:
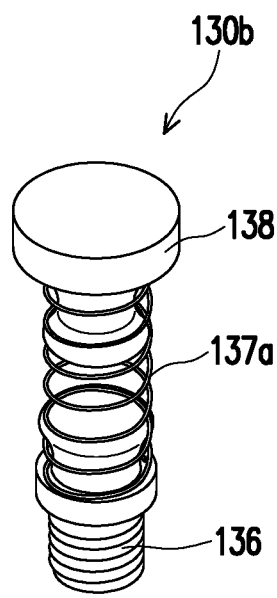
FIG. 4C is a schematic three-dimensional view of an abutting member for an electronic device according to yet another embodiment of the present invention.

FIG. 4C is a schematic three-dimensional view of an abutting member for an electronic device according to yet another embodiment of the present invention. Referring to FIG. 1, FIG. 3, and FIG. 4C, in this embodiment, as shown in FIG. 4B, the deformable portion 137a may be a spring. In other words, with regard to the abutting member 130b of this embodiment, a distance between the locking portion 136 and the supporting portion 138 is changed by a spring by virtue of its deformable characteristic, and the effect of buffering and supporting is achieved. Certainly, in other embodiments, the deformable portion 137a is not necessarily a spring, but may be any object having a same characteristic. However, the present invention is not limited thereto. In addition, in other embodiments, the spring may also be made of an insulating material, such as plastic. As such, the spring may directly support and be in contact with the M.2 expansion card 200. However, the present invention is not limited thereto.

Figure 4D:
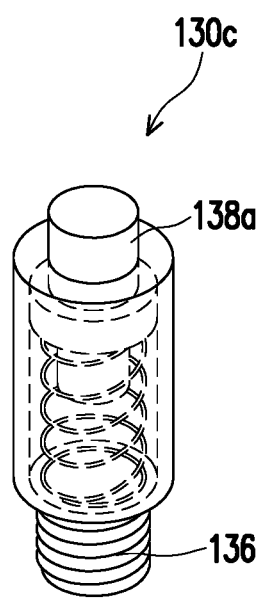
FIG. 4D is a schematic three-dimensional view of an abutting member for an electronic device according to still another embodiment of the present invention.

FIG. 4D is a schematic three-dimensional view of an abutting member for an electronic device according to still another embodiment of the present invention. Referring to FIG. 1, FIG. 3, and FIG. 4D, in this embodiment, the abutting member 130c includes a pogo pin portion 138a and a locking portion 136. In detail, in this embodiment, a spring is disposed between the pogo pin portion 138a and the locking portion 136. The abutting member 130c is locked in the second fixing hole 116 via the locking portion 136. The pogo pin portion 138a of the abutting member 130c is pushed to abut against the M.2 expansion card 200, and a portion where the pogo pin portion 138a is in contact with the M.2 expansion card 200 is made of an insulating material.

That is, a configuration of the abutting member 130c of this embodiment is the same as that of a pogo pin. However, the pogo pin portion 138a of this embodiment is made of an insulating material, to avoid a short circuit as a result of contact between the pogo pin portion and the M.2 expansion card 200. Moreover, the other end of the abutting member 130c of this embodiment that is opposite to the pogo pin portion 138a is designed as the locking portion 136 that can be fixed in the second fixing hole 116. Further, in this embodiment, a spring is disposed between the pogo pin portion 138a and the locking portion 136. In this way, the pogo pin portion 138a can buffer and support the M.2 expansion card 200 as a result of a characteristic that the spring is retractable relative to the locking portion 136.

To sum up, in the electronic device of the present invention, when the M.2 expansion card is installed on the motherboard module, the connecting end is inserted into the expansion card slot, and the locking member passes through the semi-circular hole to fix the M.2 expansion card in the first fixing hole. At this time, the first end of the abutting member is detachably fixed in the second fixing hole, and the second end of the abutting member abuts against the M.2 expansion card. That is, the M.2 expansion card is not only supported at the connecting end and the fixing end, but also supported by the abutting member disposed between the first fixing hole and the expansion card slot at a central portion of the M.2 expansion card. In this way, the motherboard module of the electronic device of the present invention can prevent the M.2 expansion card assembled thereon from bending and deforming and further causing the heat sink to be in incomplete contact with the M.2 expansion card. Moreover, the abutting member of the present invention is fixed in a fixing hole on the motherboard that is originally configured for fixing an M.2 expansion card of a different size. That is, the abutting member of the present invention can be installed by using the existing hole, without changing a structure of the motherboard. Therefore, the electronic device of the present invention is greatly versatile and adaptable.

Although the present invention has been disclosed with the foregoing embodiments, the embodiments are not intended to limit the present invention. One of ordinary skill in the art may make some changes and modifications without departing from the spirit and scope of the present invention. Therefore, the protection scope of the present invention is subject to the appended claims.

What is claimed is:

1. A motherboard module adapted for an M.2 expansion card to configure, the M.2 expansion card comprising a connecting end and a fixing end opposite to each other, an edge of the fixing end having a semi-circular hole, the motherboard module comprising:

a motherboard body comprising an expansion card slot, a first fixing hole, and a second fixing hole located between the first fixing hole and the expansion card slot, wherein the connecting end of the M.2 expansion card is adapted for being inserted into the expansion card slot;

a locking member detachably fixed in the first fixing hole; and an abutting member having a first end and a second end, the first end of the abutting member being detachably fixed in the second fixing hole, wherein when the M.2 expansion card is installed on the motherboard module, the connecting end is inserted in the expansion card slot, the locking member passes through the semi-circular hole to fix the M.2 expansion card in the first fixing hole, and the abutting member is adapted for being located between the M.2 expansion card and the motherboard body, and the second end abuts against the M.2 expansion card.

2. The motherboard module according to claim 1, wherein the abutting member comprises a locking portion and a supporting portion located on the locking portion, the locking portion is locked in the second fixing hole, and a hardness of the supporting portion is smaller than a hardness of the locking portion.

3. The motherboard module according to claim 2, wherein the supporting portion comprises a foam pad, a silica gel pad, or a rubber pad, and the locking portion comprises a screw.

4. The motherboard module according to claim 2, wherein the abutting member further comprises a deformable portion connected between the locking portion and the supporting portion, the deformable portion is adapted for deformation to change a distance between the locking portion and the supporting portion.

5. The motherboard module according to claim 4, wherein the deformable portion comprises a spring or a flexible bending portion.

6. The motherboard module according to claim 2, wherein the supporting portion is made of an insulating material.

7. The motherboard module according to claim 2, wherein the supporting portion has an outer diameter larger than an outer diameter of the locking portion and smaller than a width of the M.2 expansion card.

8. The motherboard module according to claim 1, wherein the abutting member comprises a pogo pin portion and a locking portion, the locking portion is locked in the second fixing hole, the pogo pin portion is pushed to abut against the M.2 expansion card, and a portion where the pogo pin portion is in contact with the M.2 expansion card is made of an insulating material.

9. The motherboard module according to claim 1, wherein a distance between the abutting member and the expansion card slot is between 40 mm and 85 mm when the first end of the abutting member is fixed in the second fixing hole.

10. An electronic device comprising:

an M.2 expansion card comprising a connecting end and a fixing end opposite to each other, and an edge of the fixing end having a semi-circular hole; and the motherboard module according to claim 1, wherein when the M.2 expansion card is installed on the motherboard module, the connecting end is inserted in the expansion card slot, the locking member passes through the semi-circular hole to fix the M.2 expansion card in the first fixing hole, and the abutting member is adapted for being located between the M.2 expansion card and the motherboard body, and the second end abuts against the M.2 expansion card.

11. The electronic device according to claim 10, wherein the abutting member comprises a locking portion and a supporting portion located on the locking portion, the locking portion is locked in the second fixing hole, and a hardness of the supporting portion is smaller than a hardness of the locking portion.

12. The electronic device according to claim 11, wherein the supporting portion comprises a foam pad, a silica gel pad, or a rubber pad, and the locking portion comprises a screw.

13. The electronic device according to claim 11, wherein the abutting member further comprises a deformable portion connected between the locking portion and the supporting portion, the deformable portion is adapted for deformation to change a distance between the locking portion and the supporting portion.

14. The electronic device according to claim 13, wherein the deformable portion comprises a spring or a flexible bending portion.

15. The electronic device according to claim 11, wherein the supporting portion is made of an insulating material.

16. The electronic device according to claim 11, wherein the supporting portion has an outer diameter larger than an outer diameter of the locking portion and smaller than a width of the M.2 expansion card.

17. The electronic device according to claim 10, wherein the abutting member comprises a pogo pin portion and a locking portion, the locking portion is locked in the second fixing hole, the pogo pin portion is pushed to abut against the M.2 expansion card, and a portion where the pogo pin portion is in contact with the M.2 expansion card is made of an insulating material.

18. The electronic device according to claim 10, wherein a distance between the abutting member and the expansion card slot is between 40 mm and 85 mm when the first end of the abutting member is fixed in the second fixing hole.

* * * * *